United States Patent [19]

Kumada et al.

[11] Patent Number: 5,204,218
[45] Date of Patent: Apr. 20, 1993

[54] PHOTOSENSITIVE RESIN COMPOSITION

[75] Inventors: Teruhiko Kumada; Youko Tanaka; Hideo Horibe; Shigeru Kubota; Hiroshi Koezuka, all of Hyogo, Japan

[73] Assignee: Mitsubishi Denki Kabushiki Kaisha, Tokyo, Japan

[21] Appl. No.: 717,281

[22] Filed: Jun. 17, 1991

[30] Foreign Application Priority Data

Jun. 19, 1990 [JP] Japan .................................. 2-160630
Jun. 4, 1991 [JP] Japan .................................. 3-132472

[51] Int. Cl.$^5$ ..................... G03C 1/492; G03C 1/725; C08F 2/46; G03F 7/025
[52] U.S. Cl. .................................. 430/270; 430/280; 430/281; 522/68; 522/67
[58] Field of Search ........................ 430/270, 280, 281; 522/68, 69

[56] References Cited

U.S. PATENT DOCUMENTS

| 4,022,617 | 5/1977 | McGuckin | 430/351 |
| 4,603,101 | 7/1986 | Crivello | 430/270 |
| 4,996,136 | 2/1991 | Houlihan et al. | 430/270 |

FOREIGN PATENT DOCUMENTS 0425142 5/1991 European Pat. Off.

OTHER PUBLICATIONS

"Acid Hardening Positive Photoresist Using Photochemical Generation of Base", Journal of Photopolymer Science and Technology, by Mark R. Winkle et al, vol. 3, No. 3, pp. 419–422, 1990.
"Aqueous Base Developable Deep UV Resist Systems Based on Novel Monomeric and Polymeric Dissolution Inhibitors", SPIE, vol. 920 Advances in Resist Technology and Processing V, by Hiroshi Ito, pp. 33–41, 1988.

Primary Examiner—Marion E. McCamish
Assistant Examiner—Susan Berman
Attorney, Agent, or Firm—Lowe, Price, LeBlanc & Becker

[57] ABSTRACT

Disclosed herein is a photosensitive resin composition containing:

a photobase generator expressed in the following general formula (I):

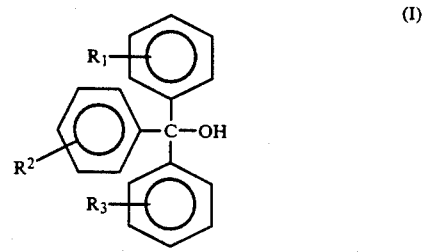

where $R_1$, $R_2$ and $R_3$ are individually selected from the group consisting of hydrogen, halogen, alkyl groups, alkenyl groups, alkinyl groups, phenyl groups and alkoxy groups; and a base-catalytic reaction compound which is cured or decomposed under basic conditions.

23 Claims, No Drawings

PHOTOSENSITIVE RESIN COMPOSITION

BACKGROUND OF THE INVENTION

1. Field of the Invention

The present invention relates to a photosensitive resin composition, which is applicable to formation of a pattern for a semiconductor device such as a printed wiring board, VLSI or the like, for example.

2. Description of the Background Art

A pattern for a semiconductor element, a printed wiring board or the like is currently formed by photolithography. Such a pattern is formed through a resist material, which is exposed by an active beam such as a radiation beam. In general, such a resist material has been prepared from a compound which is decomposed or cured by radiation exposure. However, since such a general compound consecutively reacts upon radiation exposure, it has been impossible to greatly increase sensitivity of the resin material.

In order to solve such a problem, new resist materials have recently been studied in consideration of a chemically amplified mechanism. For example, a report by Hiroshi Ito, Proc. SPIE, Vol. 920, pp. 33–41 (1988) discloses such a chemically amplified resist material. This resist material contains the compound which generates an acid catalyst upon radiation exposure and heat treatment is performed to facilitate reaction. Since the radiation may be applied in a quantity for generating the acid by an amount for serving as a catalyst, it is possible to obtain an extremely sensitive resist material.

In such a method, however, available materials for the catalyst are restricted since the acid is generated by radiation exposure. In the system of generating an acid through radiation exposure, further, active species of protons are extremely small. Therefore, the reaction is diffused in places other than the region ensured by the heat treatment, to problematically reduce the resolution.

When the conventional resist material is applied to a printed board, the acid generated by light exposure inevitably corrodes copper wires which are provided on the board. Thus, it has been problematic to employ a resist material which is prepared by a decomposition reaction mechanism with an acid catalyst.

Mark R. Winkle et al., J. Photopolym. Sci. Technal, Vol. 3, pp. 419–422 (1990) discloses a resist material prepared by using a photobase generator which generates a base upon radiation exposure. According to the method disclosed in this literature, an acid is neutralized by a base which is generated upon light exposure to induce reaction in portions other than that exposed to the light, thereby forming a pattern. In the reaction-induced portions, therefore, reaction takes place through the acid serving as a catalyst, to cause a problem which is similar to that of the case employing the acid catalyst.

SUMMARY OF THE INVENTION

An object of the present invention is to provide a photosensitive resin composition having radiation sensitivity which is substantially identical or superior to that of a general composition as well as high resolution, and not corroding metal.

The photosensitive resin composition according to the present invention contains:

a photobase generator expressed in the following general formula (I):

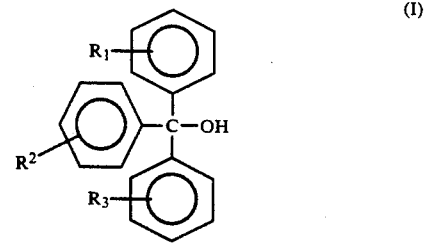

where $R_1$, $R_2$ and $R_3$ are individually selected from the group consisting of hydrogen, halogen, alkyl groups, alkenyl groups, alkinyl groups, phenyl groups and alkoxy groups; and a base-catalytic reaction compound which reacts under basic conditions.

According to the present invention, the content of the photobase generator is preferably 0.5 to 20 percent by weight of the composition. More preferably, the content of the photobase generator is 1 to 10 percent by weight.

The photobase generator may be prepared from triphenylmethanol, tri(p-methoxyphenyl)methanol, tri(p-chlorophenyl)methanol, tri(p-methylphenyl)methanol, tri(p-tert-butoxyphenyl)methanol, tri(p-isopropenylphenyl)methanol, di(p-methoxyphenyl)phenylmethanol, or di(p-methoxyphenyl)p-chlorophenylmethanol, for example.

According to the present invention, the base-catalytic reaction compound can be prepared from a compound which is cured or decomposed under basic conditions.

A compound which is cured under basic conditions may be prepared from a compound having epoxy group, or α-cyanoacrylic ester, for example.

The following are the modes in which the resist material becomes insoluble in a developer by the reaction of the base-catalytic reaction compound.

(A1) When the resist material is mainly composed of a base-catalytic reaction compound, the base-catalytic reaction compound polymerizes, to be insolubilized with respect to the developer for itself.

(A2) When the resist material is mainly composed of a base-catalytic reaction compound and a polymer which is soluble in a developer, the base-catalytic reaction compound polymerizes for itself to be increased in molecular weight, thereby suppressing solubility of the polymer with respect to the developer. As the result, the resist material is entirely insolubilized with respect to the developer.

(A3) When the resist material is mainly composed of a base-catalytic reaction compound and a polymer having functional group, the base-catalytic reaction compound reacts with the polymer to form a bridged structure, which is insoluble in a developer.

A compound which is decomposed under basic conditions may be prepared from a compound having a chemical structure such as carboxylic ester, carbonic ester or sulfonate.

The following are the modes in which the resist material becomes soluble in a developer by the reaction of the base-catalytic reaction compound.

(B1) When the resist material is mainly composed of a base-catalytic reaction compound, the base-catalytic reaction compound is decomposed so that the compound itself is converted from an insoluble state to a soluble state with respect to a developer.

(B2) When the resist material is mainly composed of a base-catalytic reaction compound and a polymer which is soluble in a developer, solubility of the polymer with respect to the developer is suppressed by the base-catalytic reaction compound before the same is decomposed. After the base-catalytic reaction compound is decomposed, the resist material is entirely solubilized with respect to the developer.

The base-catalytic reaction compound which is cured or decomposed under basic conditions may be prepared from a low molecular weight compound or a polymer. When the base-catalytic reaction compound is employed with a polymer, the content of the base-catalytic reaction compound is preferably 3 to 40 percent by weight of the composition.

The photobase generator employed in the present invention forms triphenylmethyl cations and hydroxyl group ions, serving as a base catalyst, upon radiation exposure, as expressed in the following formula:

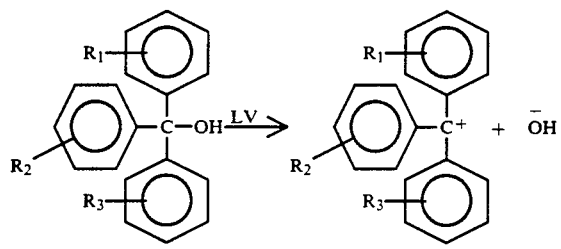

The hydroxyl group ions hydrolyze chemical bonds of ester etc. to solubilize the compound, or react with functional group such as epoxy group to cure the compound, thereby insolubilizing the same with respect to the developer.

A method of forming a pattern through a resist material containing the photosensitive resin composition according to the present invention is now described.

First, a resist film containing a photobase generator and a base-catalytic reaction compound is formed on a substrate. This step can be carried out by forming the film by spin coating or the like, for example, and heating/drying the film with an oven or a hot plate.

A light source for radiation exposure may be formed by a high pressure mercury lamp, a xenon-mercury lamp, an excimer laser, an electron beam source, a soft X-irradiation source, or the like.

After the film is exposed, heat treatment is generally performed with an oven or a hot plate to facilitate chemical reaction, thereby reducing the exposure value required for pattern formation. A patterning step can be carried out using a polar catalyst such as an alkali solution or an organic solvent.

According to the inventive photosensitive resin composition, a base is generated in place of an acid to form a resist material, whereby it is possible to prevent metal corrosion. Further, since the inventive photosensitive resin composition has radiation sensitivity which is substantially identical or superior to that of a conventional composition as well as high resolution, it is possible to effectively apply the composition to fabrication of a semiconductor device such as a printed board or VLSI, which requires a fine pattern.

DESCRIPTION OF THE PREFERRED EMBODIMENTS

EXAMPLE 1

2 g of poly(p-tert-butoxycarbonyloxy) styrene and 0.1 g of triphenylmethanol were dissolved in 10 ml of cyclohexane, to prepare a photosensitive resin composition. A resist solution containing this photosensitive resin composition was spin-coated on a silicon substrate at 3000 r.p.m. After the coating, the resist solution was heated at 80° C. for 15 minutes to prepare a resist film, which was 2000 $\mu$m in thickness.

This film was exposed to a beam from a KrF excimer laser at 20 mJ/cm$^2$ through a mask. Then the film was heated at 100° C. for 5 minutes. Thereafter the film was developed with 2.38% tetramethylammoniumhydroxide for 60 seconds. According to this Example, reaction of the aforementioned type (B1) took place. As the result, it was possible to resolve lines and spaces of 0.30 $\mu$m.

TABLE 1

| Example | Compound 1 | | Compound 2 | Photosensitivity Type | Exposure Light Source/ Sensitivity | Developer/ Developing Time |
|---|---|---|---|---|---|---|
| 2 | Triphenylmethanol | 0.2 g | Cresol novolak Bis(4-p-tert-butoxycarbonyl)bisphenolA | 2.0 g 1.0 g | B2 | KrF excimer laser/20mJcm$^{-2}$ | TMAH2.38%/ 50 sec. |
| 3 | Triphenylmethane | 0.1 g | Poly-p-vinyl-tert-Butylbenzoate | 3.0 g | B1 | KrF excimer laser/25mJcm$^{-2}$ | TMAH2.38%/ 70 sec. |
| 4 | Triphenylmethanol | 0.1 g | Cresol novolak Di-tert-butylisophtalate | 2.4 g 0.6 g | B2 | Electron beam/3.0 $\mu$c | TMAH2.38%/ 45 sec. |
| 5 | Triphenylmethanol | 0.4 g | Poly-p-vinylphenol Diethyl-m-benzenedisulfonate | 2.0 g 1.0 g | B2 | KrF excimer laser/30mJcm$^{-2}$ | TMAH2.38%/ 90 sec. |
| 6 | Triphenylmethanol | 0.3 g | Poly(glycidylmethacrylate-co-poly-p-vinylphenol | 3.0 g | A1 | Deep UV/20mJcm$^{-2}$ | CHCl$_3$:IPA = 3:1/ 60 sec. |
| 7 | Triphenylmethanol | 0.2 g | Poly-p-vinylphenol N-hexyl-α-cyanoacrylate | 2.2 g 0.8 g | A2 | KrF excimer laser/30mJcm$^{-2}$ | CHCl$_3$:IPA = 1:1/ 60 sec. |
| 8 | Tri(p-methoxyphenyl)methanol | 0.1 g | Poly(-tert-butoxycarbonyloxy)styrene | 2.5 g | B1 | Electron beam/1.5 $\mu$c | TMAH2.38%/ 60 sec. |
| 9 | Tri(p-methoxyphenyl)methanol | 0.2 g | Cresol novolak Bis(4-p-tert-butoxycarbonyl_bisphenolA | 2.5 g 0.5 g | B2 | KrF excimer laser/10mJcm$^{-2}$ | TMAH2.38%/ 50 sec. |
| 10 | Tri(p-methoxyphenyl)methanol | 0.4 g | Poly-p-vinylphenol Diethyl-m-benzenedisulfonate | 2.0 g 1.0 g | B2 | KrF excimer laser/15mJcm$^{-2}$ | TMAH2.38%/ 90 sec. |
| 11 | Tri(p-methoxyphenyl)methanol | 0.2 g | Polyglycidylmethacrylate-co-poly-p-vinylphenol) | 3.0 g | A1 | Electron beam/2.5 $\mu$c | CHCl$_3$:IPA = 3:1/ 60 sec. |
| 12 | Tri(p-chlorophenyl) | 0.3 g | Poly(-tert- | 3.0 g | B1 | Electron beam/2.0 $\mu$c | TMAH2.38%/ |

TABLE 1-continued

| Example | Compound 1 | | Compound 2 | | Photo-sensitivity Type | Exposure Light Source/ Sensitivity | Developer/ Developing Time |
|---|---|---|---|---|---|---|---|
| 13 | Tri(p-chlorophenyl) methanol | 0.1 g | butoxycarbonyloxy)styrene Poly-p-vinyl-tert-butylbenzoate | 3.0 g | B1 | KrF excimer laser/20mJcm$^{-2}$ | 60 sec. TMAH2.38%/ 70 sec. |
| 14 | Tri(p-cholorphenyl) methanol | 0.2 g | Poly-p-vinylphenol N-hexyl-α-cyanoacrylate | 2.2 g 0.8 g | A2 | KrF excimer laser/25mJcm$^{-2}$ | CHCl$_3$:IPA = 1:1/ 60 sec. |
| 15 | Tri(p-methylphenyl) methanol | 0.2 g | Poly(-tert-butoxycarbonyloxy_styrene | 3.0 g | B1 | Electron bema/4.0 μc | TMAH2.38% 60 sec. |
| 16 | Tri(p-methylphenyl) methanol | 0.1 g | Poly-p-vinylphenol Diethyl-α-benzenedisulfonate | 1.8 g 1.2 g | B2 | KrF excimer laser/30mJcm$^{-2}$ | TMAH2.38%/ 90 sec. |
| 17 | Tri(p-methylphenyl) methanol | 0.2 g | Polyglycidylmethacrylate-co-poly-p-vinylphenol | 3.0 g | A1 | Deep UV/35mJcm$^{-2}$ | CHCl$_3$:IPA = 3:1/ 60 sec. |
| 18 | Triphenylmethanol | 0.1 g | Poly(p-tert-butylcarbonyl oxystyrene-co-p-hydroxystyrene) Di-tert-butylisophthalate | 2.0 g 1.0 g | B1 + B2 | KrF excimer laser/30mJcm$^{-2}$ | TMAH2.38%/ 70 sec. |
| 19 | Tri(p-methoxyphenyl) methanol | 0.2 g | Poly(p-tert-butylcarbonyl oxystyrene-co-p-hydroxystyrene) Di-tert-amylterephthalate | 2.0 g 1.0 g | B1 + B2 | KrF excimer laser/15 mJcm$^{-2}$ | TMAH2.38%/ 60 sec. |
| 20 | Tri(p-tert butoxyphenyl) methanol | 0.1 g | Poly(p-tert-butylcarbonyl) oxystyrene-co-p-hydroxystyrene) Bis(4-p-tert-butoxycarbonyl)bisphenols | 2.0 g 1.0 g | B1 + B2 | KrF excimer laser/18mJcm$^{-2}$ | TMAH2.38%/ 70 sec. |
| 21 | Tri(p-methoxyphenyl) methanol | 0.3 g | Cresol novolak Poly(m-benzenedisulfonic acid-co-ethyleneglycol) | 2.0 g 1.0 g | B2 | KrF excimer laser/12mJcm$^{-2}$ | TMAH2.38%/ 60 sec. |
| 22 | Tri(p-chlorophenyl) methanol | 0.1 g | Cresol novolak Poly(m-benzenedisulfonic acid-co-butyreneglycol) | 2.2 g 0.8 g | B2 | KrF excimer laser/25mJcm$^{-2}$ | TMAH2.38%/ 50 sec. |
| 23 | Tri(p-tert-butoxyphenyl) methanol | 0.2 g | Poly(p-vinlyphenol) Poly(p-benzenediacrylic acid-di tert-amylester) | 1.8 g 1.2 g | B2 | Electron beam/1.5 μc | TMAH2.38%/ 60 sec. |
| 24 | Tri(p-methoxyphenyl) methanol | 0.1 g | Poly(p-vinylphenol) Poly(p-benzenediacrylic acid-di-tert-butylester) | 2.5 g 0.5 g | B2 | Electron beam/1.0 μc | TMAH2.38%/ 60 sec. |
| 25 | Tri(p-methoxyphenyl) methanol | 0.3 g | Poly(p-vinylphenol) Polyglycidylmethacrylate | 1.8 g 1.2 g | A3 | KrF excimer laser/30mJcm$^{-2}$ | TMAH2.38%/ 90 sec. |
| 26 | Tri(p-isopropenyl-phenyl)methanol | 0.1 g | Poly(-tert-butoxycarbonyloxy)styrene | 3.0 g | B1 | Electron beam/4.0 μc | TMAH2.38%/ 60 sec. |
| 27 | Di(p-methoxyphenyl) phenyl methanol | 0.3 g | Poly(glycidylmethacrylate-co-poly-p-vinylphenol) | 3.0 g | A1 | Deep UV/35mJcm$^{-2}$ | CHCl$_3$:IPA = 3:1/ 60 sec. |
| 28 | Di(p-methoxy-phenyl)p-chloropheynylmethanol | 0.3 g | Poly(p-tert-butylcarbonyloxystyrene-co-p-hydroxystyrene) Di-tert-amylterephthalate | 2.0 g 1.0 g | B2 | KrF excimer laser/20mJcm$^{-2}$ | TMAH2.38%/ 60 sec. |

EXAMPLES 2 to 28

Photobase generators (compounds 1) and base-catalytic reaction compounds (compounds 2) shown in Table 1 were employed for preparing resist films containing photosensitive resin compositions in a similar manner to Example 1. Table 1 also shows the aforementioned photosensitivity types A1 to A3, B1 and B2. Examples 18 to 20 caused both reactions of the types B1 and B2. Patterns were formed in a similar manner to Example 1. Table 2 shows the results.

TABLE 2

| Example | Negative/Positive | Resolution |
|---|---|---|
| 2 | Positive | 0.30 μm |
| 3 | Positive | 0.35 μm |
| 4 | Positive | 0.45 μm |
| 5 | Positive | 0.40 μm |
| 6 | Negative | 0.70 μm |
| 7 | Negative | 0.50 μm |
| 8 | Positive | 0.30 μm |
| 9 | Positive | 0.40 μm |
| 10 | Positive | 0.35 μm |
| 11 | Negative | 0.60 μm |
| 12 | Positive | 0.30 μm |
| 13 | Positive | 0.35 μm |
| 14 | Negative | 0.50 μm |
| 15 | Positive | 0.35 μm |
| 16 | Positive | 0.40 μm |
| 17 | Negative | 0.55 μm |
| 18 | Positive | 0.30 μm |
| 19 | Positive | 0.30 μm |
| 20 | Positive | 0.35 μm |
| 21 | Positive | 0.45 μm |
| 22 | Positive | 0.50 μm |
| 23 | Positive | 0.25 μm |
| 24 | Positive | 0.25 μm |
| 25 | Negative | 0.30 μm |
| 26 | Positive | 0.45 μm |
| 27 | Negative | 0.50 μm |
| 28 | Positive | 0.25 μm |

As clearly understood from Table 2, it was possible to obtain patterns of high sensitivity and high resolution in all Examples.

According to the inventive photosensitive resin composition, as hereinabove described, it is possible to relieve process conditions, which have been restricted in a conventional method of forming a pattern by activating an acid through radiation exposure. Thus, a stable pattern can be easily formed by employing the photosensitive resin composition according to the present invention.

What is claimed is:

1. A photosensitive resin composition containing:
a photobase generator expressed in the following general formula (I):

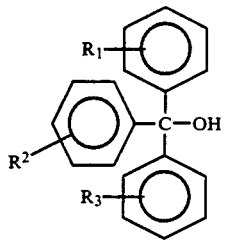

where $R_1$, $R_2$ and $R_3$ are individually selected from the group consisting of hydrogen, halogen, alkyl groups, alkenyl groups, alkinyl groups, phenyl groups and alkoxy groups; and
a base-catalytic reaction compound which reacts under basic conditions.

2. A photosensitive resin composition in accordance with claim 1, wherein the content of said photobase generator is 0.2 to 20 percent by weight of said composition.

3. A photosensitive resin composition in accordance with claim 1, wherein the content of said photobase generator is 1 to 10 percent by weight of said composition.

4. A photosensitive resin composition in accordance with claim 1, wherein said photobase generator is selected from a group of triphenylmethanol, tri(p-methoxyphenyl)methanol, tri(p-chlorophenyl)methanol, tri(p-methylphenyl)methanol, tri(p-tert-butoxyphenyl)methanol, tri(p-isopropenylphenyl)methanol, di(p-methoxyphenyl)phenylmethanol and di(p-methoxyphenyl)p-chlorophenylmethanol.

5. A photosensitive resin composition in accordance with claim 4, wherein said base-catalytic reaction compound is a compound which is insolubilized with respect to a developer for itself by polymerization.

6. A photosensitive resin composition in accordance with claim 4, wherein said base-catalytic reaction compound is employed with a polymer which is soluble in a developer, so that solubility of said polymer with respect to said developer is suppressed by polymerization of said base-catalytic reaction compound.

7. A photosensitive resin composition in accordance with claim 6, wherein the content of said base-catalytic reaction compound is 3 to 40 percent by weight of said composition.

8. A photosensitive resin composition in accordance with claim 4, wherein said base-catalytic reaction compound is employed with a polymer having functional group, so that said base-catalytic reaction compound reacts with said polymer to form a bridged structure, thereby insolubilizing said composition with respect to a developer.

9. A photosensitive resin composition in accordance with claim 8, wherein the content of said base-catalytic reaction compound is 3 to 40 percent by weight of said composition.

10. A photosensitive resin composition in accordance with claim 1, wherein said base-catalytic reaction compound is a low molecular weight compound.

11. A photosensitive resin composition in accordance with claim 1, wherein said base-catalytic reaction compound is a polymer.

12. A photosensitive resin composition in accordance with claim 1, wherein said base-catalytic reaction compound is a compound which is cured under basic conditions.

13. A photosensitive resin composition in accordance with claim 12, wherein said base-catalytic reaction compound is a compound containing epoxy group.

14. A photosensitive resin composition in accordance with claim 12, wherein said base-catalytic reaction compound is α-cyanoacrylic ester.

15. A photosensitive resin composition in accordance with claim 1, wherein said base-catalytic reaction compound is a compound which is decomposed under basic conditions.

16. A photosensitive resin composition in accordance with claim 15, wherein a chemical structure decomposed under basic conditions is carboxylic ester.

17. A photosensitive resin composition in accordance with claim 15, wherein a chemical structure decomposed under basic conditions is carbonic ester.

18. A photosensitive resin composition in accordance with claim 15, wherein a chemical structure decomposed under basic conditions is sulfonate.

19. A photosensitive resin composition in accordance with claim 15, wherein a chemical structure decomposed under basic conditions exists in part of said polymer.

20. A photosensitive resin composition in accordance with claim 15, wherein a chemical structure decomposed under basic conditions exists in a compound suppressing dissolution of a polymer which is soluble in a developer.

21. A photosensitive resin composition in accordance with claim 20, wherein said compound suppressing dissolution of said polymer is a low molecular weight compound.

22. A photosensitive resin composition in accordance with claim 20, wherein said compound suppressing dissolution of said polymer is a polymer.

23. A photosensitive resin composition in accordance with claim 20, wherein the content of said base-catalytic reaction compound is 3 to 40 percent by weight of said composition.

* * * * *